United States Patent [19]
Bui et al.

[11] Patent Number: 5,689,139
[45] Date of Patent: Nov. 18, 1997

[54] ENHANCED ELECTROMIGRATION LIFETIME OF METAL INTERCONNECTION LINES

[75] Inventors: Nguyen Duc Bui, San Jose; Donald L. Wollesen, Saratoga, both of Calif.

[73] Assignee: Advanced Micro Devices, Inc., Sunnyvale, Calif.

[21] Appl. No.: 526,189

[22] Filed: Sep. 11, 1995

[51] Int. Cl.$^6$ .................. H01L 23/528; H01L 23/535
[52] U.S. Cl. .................. 257/758; 257/211; 257/767; 257/775
[58] Field of Search .................. 257/207, 211, 257/750, 758, 763–765, 767, 776, 920, 775

[56] References Cited

U.S. PATENT DOCUMENTS

| | | | |
|---|---|---|---|
| 5,060,045 | 10/1991 | Owada et al. | 257/211 |
| 5,093,279 | 3/1992 | Andreshak et al. | 437/173 |
| 5,101,261 | 3/1992 | Maeda | 357/68 |
| 5,136,361 | 8/1992 | Wollesen et al. | 357/67 |
| 5,262,354 | 11/1993 | Cote et al. | 437/195 |
| 5,289,036 | 2/1994 | Nishimoto | 257/774 |
| 5,329,162 | 7/1994 | Nadaoka | 257/774 |
| 5,382,831 | 1/1995 | Atakov et al. | 257/767 |
| 5,391,920 | 2/1995 | Tsuji | 257/207 |
| 5,461,260 | 10/1995 | Varker et al. | 257/773 |
| 5,470,788 | 11/1995 | Biery et al. | 437/190 |

FOREIGN PATENT DOCUMENTS

| | | | |
|---|---|---|---|
| 0160392 | 11/1985 | European Pat. Off. | 257/920 |
| 0227569 | 10/1991 | Japan | 257/207 |

OTHER PUBLICATIONS

IBMTDB, Elimination of CMOS Electromigration–Induced Extrusions, vol. 31, No. 6, Nov. 1988 pp. 461, 462, 257/767.
Blech, "Electromigration in thin aluminum films on titanium nitride," Journal of Applied Physics, vol. 47, No. 4, Apr. 1976, pp. 1203–1208.
Li et al., "Increase in Electromigration Resistance by Enhancing Backflow Effect," IEEE/RPS, 1992, pp.211–216.
Joshi, "A New Damascene Structure for Submicrometer Interconnect Wiring," IEEE Electron Letters, vol. 14, No. 3, Mar. 1993, pp. 129–132.
Kaanta et al., "Dual Damascene: A ULSI Wiring Technology," Jun. 11–12, 1991, VMIC Conference, IEEE, pp. 144–152.
Kenney et al., "A Buried–Plate Trench Cell for a 64–Mb DRAM," 1992 Symposium on VLSI Technology Digest of Technical Papers, IEEE, pp. 14–15.
Zhang et al., "An Increase of the Electromigration Reliability of Ohmic Contacts by Enhancing Backflow Effect," Apr. 4–6, 1995, IEEE International Reliability Physics Proceedings, pp. 365–370.

*Primary Examiner*—Peter Toby Brown
*Attorney, Agent, or Firm*—Lowe, Price, LeBlanc & Becker

[57] ABSTRACT

The electromigration lifetime of a metal interconnection line is increased by adjusting the length of the interconnection line or providing longitudinally spaced apart holes or vias to optimize the backflow potential capacity of the metal interconnection line. In addition, elongated slots are formed through the metal interconnection line so that the total width of metal across the interconnection line is selected for optimum electromigration lifetime in accordance with the Bamboo Effect for that metal.

8 Claims, 3 Drawing Sheets

ENHANCED ELECTROMIGRATION LIFETIME OF METAL INTERCONNECTION LINES

TECHNICAL FIELD

The present invention relates to a semiconductor device containing an interconnection line, and to a method of manufacturing the semiconductor device, wherein the lifetime of the interconnection line is maximized with respect to electromigration failure.

BACKGROUND ART

Conventional semiconductor devices typically comprise a semiconductor substrate, a plurality of insulating and conductive levels formed thereon having a conductive interconnection pattern comprising features and spacings, such as a plurality of spaced apart conductive lines, and several types of conductive interconnection lines, such as bus lines, power supply lines and clock lines, having a width greater than the width of the minimum width conductive lines according to the design rule of the semiconductor device. Increasing demands for density and performance associated with ultra-large scale integration semiconductor wiring require responsive changes in interconnection technology which is considered one of the most demanding aspects of ultra-high scale integration technology. High density demands for ultra-large scale integration semiconductor wiring require planarized layers with minimal design features and spacings, including spacing between conductive lines.

A limitation on the lifetime and reliability of conventional semiconductor devices attributed to conductive interconnection lines is due to electromigration. The phenomenon of electromigration involves the flow of electrons causing the migration of atoms, thereby generating voids and hillocks. The formation of voids creates an opening in a conductive interconnection line, thereby decreasing the performance of the interconnection line. The formation of voids generates areas of increased resistance which undesirably reduce the speed of a semiconductor device. Thus, the electromigration phenomenon constitutes a limitation on the lifetime of a conductive interconnection line as well as the performance of the semiconductor device.

Electromigration in a metal interconnection line can be characterized by the movement of ions induced by a high electrical current density. As the miniaturization of the feature sizes of semiconductor devices increases, the current density also increases and, hence, electromigration induced metallization failures increase. Current metallization failures resulting from electromigration exceed about 30% of the total of metallization failures.

Prior attempts to restrain electromigration involve the use of overcoating, alloying, or multilevel metallization, which approaches do not directly address the electromigration phenomenon. In co-pending U.S. patent application Ser. No. 08/476,512 (our docket no. 1033-106 filed on Jun. 7, 1995), an approach is disclosed to enhance the electromigration lifetime of a metal interconnection line by optimizing the width of the metal interconnection line consistent with the minimum time for 50% failure by electromigration according to the Bamboo Effect for the metal. The disclosed technique comprises the formation of one or more slots through the metal interconnection line, wherein the number, length and width of each slot is determined by the Bamboo Effect for that metal so that the width of actual metal across the interconnection line, between the slots, is less than that which corresponds to the minimum time for 50% failure by electromigration according to the Bamboo Effect for that metal. The entire disclosure of copending U.S. patent application Ser. No. 08/476,512 (our Docket No. 1033-106 filed on Jun. 7, 1995), is incorporated herein by reference.

In a study of the kinetics of electromigration in the 1970's, it was reported that electromigration induced metallic ion accumulation generates a chemical potential gradient which is capable of counteracting or driving the ions in the opposite direction caused by electromigration. This phenomenon is characterized as the Backflow Effect. See Blech, "Electromigration in thin aluminum films on titanium nitride," Journal of Applied Physics, Vol. 47, No. 4, April 1976, pp. 1203–1208.

A subsequent research study on electromigration and the Backflow Effect is reported by Li et al., "Increase in Electromigration Resistance by Enhancing Backflow Effect," IEEE/RPS, 1992, pp. 211–216. Li et al. refer to the work of Dr. Blech and his study of the kinetics of electromigration and the Backflow Effect which was characterized as an inverse electromigration effect which can be employed to offset a certain amount of electromigration induced ion flow. The work reported by Li et al. is directed to enhancing the Backflow Effect and, hence, decreasing electromigration.

In copending U.S. patent application Ser. No. 08/511,878 (our Docket No. 1033-116), an approach is disclosed to enhance the electromigration lifetime of a metal interconnection line by optimizing the length, providing one or more strategically longitudinally spaced openings or adjusting the distance between the points at which the metal interconnection line is in electrical contact with conductive vias, so that the length, distance between the openings or distance between the ends of the interconnection line and an opening, or the longitudinal distance between the conductive vias, is less than the length corresponding to the minimum Backflow Potential Capacity of the metal interconnection line. The entire disclosure of copending U.S. patent application Ser. No. 08/511,878 (our Docket No. 1033-116 filed on Aug. 4, 1995), is incorporated herein in its entirety by reference.

The requirement for long electromigration lifetime remains of critical importance for an interconnection system, particularly an interconnection system in semiconductor devices comprising conductive patterns having submicron features and spacings such as conductive patterns having features greater than about three times the minimum allowed feature for a given design rule involving high electrical current density. Thus, there remains a need in the semiconductor art for increasing the electromigration lifetime of an interconnection line.

DISCLOSURE OF THE INVENTION

An object of the present invention is a highly integrated semiconductor device containing an interconnection structure having an enhanced electromigration lifetime.

Another object is an improved method of manufacturing a semiconductor device having a metal interconnection line with an enhanced electromigration lifetime.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a semiconductor device comprising: a conductive pattern having features; an insulating layer formed on the conductive pattern; and a metal interconnection line formed on the insulating layer; wherein the metal interconnection line has a length less than the length corresponding to the minimum Backflow Potential Capacity for the metal interconnection line; the metal interconnection line comprise one or more slots through the metal interconnection line to the insulating layer; each slot has a length greater than its width; each slot has a maximum width less than the minimum spacing between the conductive lines; and the minimum width of each slot is equal to the limit of etching or photolithography technology.

Another aspect of the present invention is a semiconductor device comprising: a conductive pattern having features; a first insulating layer formed on the conductive pattern; a first metal interconnection line formed on the first insulating layer; a second insulating layer formed on the first metal interconnection line; and at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; wherein: the metal interconnection line comprise one or more slots through the metal interconnection line to the insulating layer; each slot has a length greater than its width; each slot has a maximum width less than the minimum spacing between the conductive lines; and the minimum width of each slot is equal to the limit of etching or photolithography technology.

A further aspect of the present invention is a semiconductor device comprising: a conductive pattern having features; an insulating layer formed on the conductive pattern; a metal interconnection line formed on the insulating layer having at least two longitudinally spaced apart openings; wherein the length of the metal interconnection line is greater than the length corresponding to the minimum Backflow Potential Capacity for the metal interconnection line occurs; the longitudinal distance between the two openings is less than the length corresponding to the minimum Backflow Potential Capacity for the metal interconnection line; the metal interconnection line comprise one or more slots through the metal interconnection line to the insulating layer; each slot has a length greater than its width; each slot has a maximum width less than the minimum spacing between the conductive lines; and the minimum width of each slot is equal to the limit of etching or photolithography technology.

Another aspect of the present invention is a semiconductor device comprising a conductive pattern having features; an insulating layer formed on the conductive pattern; a metal interconnection line formed on the insulating layer having an opening therethrough; wherein: the length of the metal interconnection line is greater than the length corresponding to the minimum Backflow Potential Capacity for the metal interconnection line and the longitudinal distance from each end to the opening is less than the length corresponding to the minimum Backflow Potential Capacity for the metal interconnection line; the metal interconnection line comprise one or more slots through the metal interconnection line to the insulating layer; each slot has a length greater than its width; each slot has a maximum width less than the minimum spacing between the conductive lines; and the minimum width of each slot is equal to the limit of etching or photolithography technology.

A further aspect of the present invention is a method of manufacturing a semiconductor device which method comprises: forming a first insulating layer; forming a conductive pattern comprising a plurality of spaced apart conductive lines; forming a second insulating layer on the conductive pattern; forming a metal interconnection line on the second insulating layer; forming at least one elongated slot through the interconnection line to the second insulating layer; wherein: each slot has a length greater than its width; each slot has a maximum width less than the minimum spacing between the conductive lines; the minimum width of each slot is equal to the limit of etching or photolithography technology; and the length of the metal interconnection line is less than the length corresponding to the minimum Backflow Potential Capacity for the metal interconnection line.

Another aspect of the present invention is a method of making a semiconductor device, which method comprises: forming an insulating layer; forming a conductive pattern comprising a plurality of spaced apart metal conductive lines and a metal interconnection line by a dual damascene process wherein openings are provided in the insulating layer which are subsequently filled in with the metal to simultaneously form the metal conductive lines and metal interconnection line; forming at least one elongated slot through the interconnection line to the insulating layer; wherein: each slot has a length greater than its width; each slot has a maximum width less than the minimum spacing between the conductive lines; the minimum width of each slot is equal to the limit of etching or photolithography technology; and the length of the metal interconnection line is less than the length corresponding to the minimum Backflow Potential Capacity for the metal interconnection line.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The electromigration lifetime of a metal interconnection line constitutes a significant limitation of the capabilities of conventional semiconductor devices, particularly high density devices. The electromigration failure limitation becomes particularly acute as the integrated semiconductor device becomes increasingly higher in performance (faster operating frequency) due to the corresponding increase in current density which increases the electromigration phenomenon. The present invention addresses and solves that problem by extending the electromigration lifetime of a metal interconnection line, and improving the performance of the semiconductor device.

Figure 1:
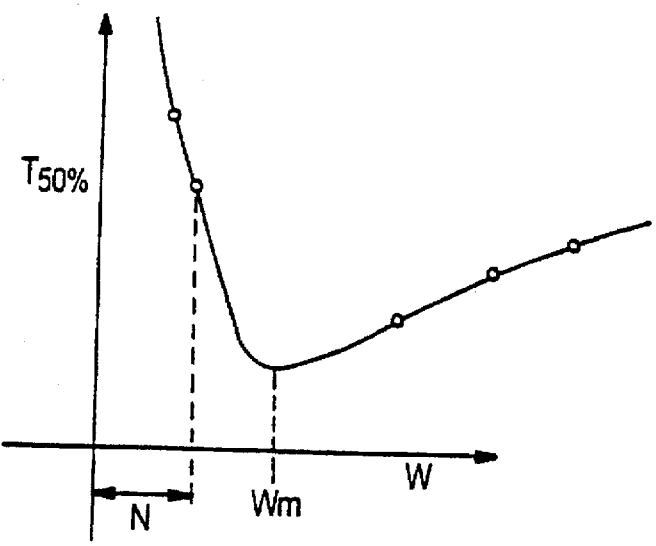
FIG. 1 is a typical curve illustrating the Bamboo Effect for a metal.

In copending U.S. patent application Ser. No. 08/476,512 (our Docket No. 1033-106 filed on Jun. 7, 1995), the entire disclosure of which is incorporated herein in its entirety by reference, an approach is disclosed to extend the electromigration lifetime of a metal interconnection line by taking advantage of the phenomenon called the "Bamboo Effect," which is related to the microstructural characteristics, particularly grain size, of a particular metal system. In order to implement the Bamboo Effect and enhance the electromigration lifetime of a metal interconnection line, the width of the metal interconnection line is optimized consistent with the minimum time for 50% failure by electromigration according to the Bamboo Effect for the metal. To achieve that objective, one or more slots are formed through the metal interconnection line, wherein the number, length and width of each slot is determined by the Bamboo Effect for the metal so that the width of actual metal across the interconnection line, between the slots, is less than that which corresponds to the minimum time for 50% failure by electromigration according to the Bamboo Effect for that metal. The typical curve shown in FIG. 1 illustrates that $T_{50\%}$ is a minimum value at $W_m$ representing the maximum width of the metal line, normally about 2 to about 2½ times the average grain size. The area to the left of or less than the minimum $T_{50\%}$, i.e., to the left of $W_m$ represents an area where the electromigration lifetime can be enhanced due to the "Bamboo Effect" where the line width is equal to the grain size or less than two and one-half times the grain size.

Figure 2:
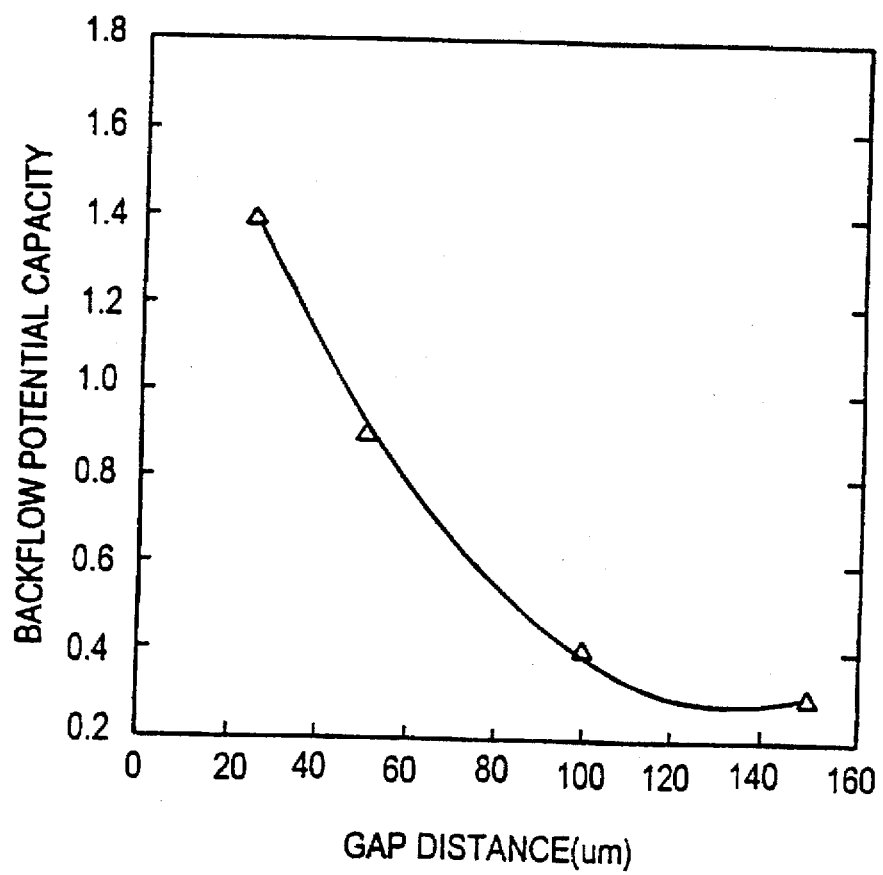
FIG. 2 is a curve illustrating the Backflow Potential Capacity for an aluminum.

In copending U.S. patent application Ser. No. 08/511,878 (our Docket No. 1033-116 filed on Aug. 4, 1995) an approach is disclosed for enhancing the electromigration lifetime of a metal interconnection line by optimizing the effective length of a metal interconnection line so that it is less than the length corresponding to the minimum backflow potential capacity for the metal interconnection line. As reported by Li et al., for a particular metal, i.e., a particular elemental metal or a particular alloy, there exists a Backflow Potential Capacity which depends on a gap distance or length of a stripe of the metal. Such a dependence of the Backflow Potential Capacity on the length is shown in FIG. 2 for aluminum. As disclosed in copending U.S. patent application Ser. No. 08/511,878 (our Docket No. 1033-116), the optimization of the Backflow Potential Capacity is achieved by limiting the length of a metal interconnection line, or providing openings and/or contact points with conductive vias separated by longitudinal distance less than length corresponding to the minimum Backflow Potential Capacity of the metal interconnection line.

In accordance with the present invention, both the Bamboo Effect and the Backflow Effect, particularly the Backflow Potential Capacity, are optimized for a particular species of metal employed in a metal interconnection line in a semiconductor device. Thus, in accordance with the present invention, a metal interconnection line is formed on an insulating layer having a width satisfying the design requirements of a particular integrated circuit, which width is greater than that which would benefit from the Bamboo Effect, the electromigration lifetime of the metal, i.e., $W_m$, is optimized. This is achieved by initially forming an interconnection line having a width consistent with the design requirements of the integrated circuit, i.e., a width greater than that which can utilize the Bamboo Effect, i.e., greater than $W_m$ in FIG. 1. However, the electromigration lifetime of such a metal interconnection line is increased by the strategic formation of one or more slots throughout the length of the interconnection line. In addition, the metal interconnection line is designed to have a length less than the length corresponding to the minimum Backflow Potential Capacity for that particular metal interconnection line. The minimum Backflow Potential Capacity must be determined for that particular metal, such as for aluminum as shown in FIG. 2.

In accordance with the present invention, various conductive metals can be employed for the interconnection line, such as aluminum, aluminum alloys, copper, copper alloys, silver, silver alloys, gold, gold alloys, refractory metals, refractory metal compounds and refractory metal alloys. The use of a metal interconnection line in accordance with the present invention can be advantageously applied in semiconductor devices having a conductive pattern comprising features greater than about three times the minimum allowed feature for a given design rule.

As disclosed in copending U.S. patent application Ser. No. 08/476,512 (our Docket No. 1033-106), the number and dimensions of the slots are strategically chosen to implement the Bamboo Effect and, thereby, enhance the electromigration lifetime of the interconnection line. Specifically, the total initial width of metal across the interconnection line, greater than $W_m$, is reduced by the formation of slots to a final width at which the electromigration lifetime is enhanced by the Bamboo Effect, i.e., less than $W_m$ in FIG. 1. In one embodiment, the slots are selected to have a maximum width which is less than the minimum spacing between conductive lines. In addition, the minimum width of each slot is limited by conventional technology, i.e., equal to the limit of etching or photolithography technology.

As also disclosed in copending U.S. patent application Ser. No. 08/476,512 (our Docket No. 1033-106), the strategic selection and design of the slots is represented by the following formula and is designated the "Slot Design Rule":

$$W = 2W_0 + S \qquad (1)$$

wherein W represents the width of the interconnection line determined by the design requirements of the particular circuitry; $W_0$ represents the width of metal across the interconnection line outside of the slots; and S represents the width of the slot which should have a maximum width less than the minimum spacings between conductive lines; and a minimum width limited by the capabilities of etching and photolithography technology.

Advantageously, the length of the slot should not be too long, i.e., less than 10 microns, thereby maintaining the resistance of the interconnection line structure in an acceptable range for circuit operations. Basically, the Slot Design Rule can be applied in systems for submicron or micron design rule for the width of conductive lines and/or inter-wiring spacing.

As disclosed in copending U.S. patent application Ser. No. 08/511,878 (our Docket No. 1033-116), the Backflow Potential Capacity can be employed to reduce electromigration in metal interconnection lines even though the metal interconnection line has a length greater than the length corresponding to the minimum Backflow Potential Capacity for that metal interconnection line. For example, a metal interconnection line is formed on an insulating layer, which metal interconnection line has a length greater than the length corresponding to the minimum Backflow Potential Capacity for the metal interconnection line. However, one or more longitudinally spaced apart openings, preferably longitudinally aligned openings, are formed through the metal interconnection line so that the distance between the ends of the metal interconnection line and an opening, or the distance between two longitudinally spaced apart openings is less than the length corresponding to the minimum Backflow Potential Capacity for the metal interconnection line. The optimum size of the opening depends upon the particular metal and the width of the metal interconnection line, and could easily be determined in a particular situation by one having ordinary skill in the art. The openings in the metal interconnection line can be formed by conventional photolithographic and etching techniques, particularly anisotropic etching, such as reactive ion etching. Damascene techniques can also be employed to form the openings.

The present invention is also applicable to multilevel interconnection patterns. Typically, semiconductor devices comprises a substrate and a plurality of levels with conductive patterns in electrical contact by means of conductive vias and interconnection lines. As disclosed in copending U.S. patent application Ser. No. 08/511,878 (our Docket No. 1033-116), the longitudinal distance between the contact points of conductive vias on the surface of a metal interconnection line is strategically designed so that it is less than the length corresponding to the minimum Backflow Potential Capacity for the particular metal interconnection line.

Figure 5:
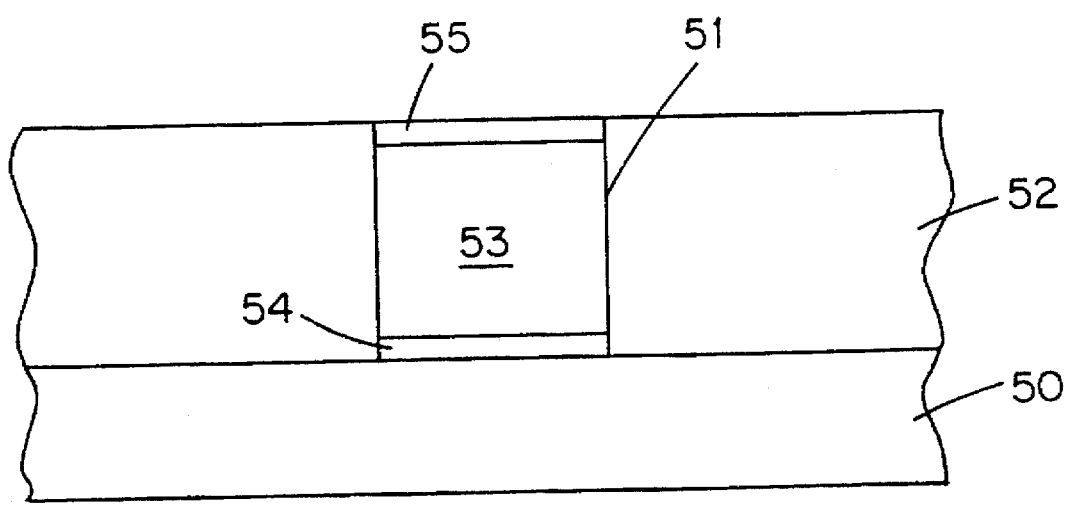
FIG. 5 schematically depicts a composite via structure in accordance with an embodiment of the present invention.

Thus, in accordance with the present invention, a semiconductor device is formed comprising a conductive pattern and a first insulating layer formed on the conductive pattern. A first metal interconnection line is formed on the first insulating layer and a second insulating layer is formed on the first metal interconnection line. In this embodiment, as in all embodiments of the present invention, the metal interconnection lines are provided with slots to optimize the Bamboo Effect as disclosed in copending U.S. patent application Ser. No. 08/476,512 (our Docket No. 1033-106). In addition thereto, the various embodiments of the present invention involve optimization of the effective length of an interconnection line in accordance with Backflow Potential Capacity to further reduce the electromigration phenomenon and, hence, further increase electromigration lifetime. Thus, at least two spaced apart first conductive vias are formed through the second insulating layer in electrical contact with the first metal interconnection line at first longitudinally spaced apart contact points a first longitudinal distance which is less than the length corresponding to the minimum Backflow Potential Capacity for the first metal interconnection line. The length of the first metal interconnection line can, therefore, exceed the length corresponding to the minimum Backflow Potential Capacity for the first metal interconnection line, while optimizing the Backflow Potential Capacity of the metal interconnection line to reduce electromigration failure. As also disclosed in copending U.S. patent application Ser. No. 08/511,878 (our Docket No. 1033-116), the Backflow Potential Capacity is further optimized by employing a material to fill the conductive via different from the metal of the interconnection line. Thus, when employing an aluminum or aluminum alloy metal interconnection line 50, as shown in FIG. 5, it is preferred to employ a tungsten plug filling the via 51 through insulating layers 52, or a plug comprising aluminum or aluminum alloy 43 with a barrier layer 54 and/or anti-reflection coating 55. Typical barrier materials include tungsten, tungsten-titanium, titanium, titanium/titanium nitride, titanium nitride or titanium oxynitride, while typical anti-reflective coatings can comprise titanium nitride or titanium oxynitride.

As further disclosed in copending U.S. patent application Ser. No. 08/511,878 (our Docket No. 1033-116), the Backflow Potential Capacity is utilized to reduce electromigration failure in a plurality of metal interconnection lines on different levels in electrical contact through a via. Thus, the present invention comprises forming a first insulating layer on a conductive pattern, and a first metal interconnection line formed on the first insulating layer. A second insulating layer is formed on the first metal interconnection line with at least two longitudinally spaced apart first conductive vias formed through the second insulating layer in electrical contact with the first metal interconnection line at first longitudinally spaced apart contact points separated by a first longitudinal distance which is less than the length corresponding to the minimum Backflow Potential Capacity for the first metal interconnection line. In addition, slots are provided in the first metal interconnection line, to optimize the Bamboo Effect. A second metal interconnection line is then formed on the second insulating layer. The Backflow Potential Capacity is optimized for the second metal interconnection line in accordance with various aspects of the present invention. For example, the Backflow Potential Capacity is optimized for the second metal interconnection line by confining its length to less than the length corresponding to the minimum Backflow Potential Capacity for the second metal interconnection line. In addition, slots are provided in the second metal interconnection line to optimize the Bamboo Effect. As disclosed in copending U.S. patent application Ser. No. 08/476,512 (our Docket No. 1033-106), the Bamboo Effect for the second metal interconnection line can also be optimized by providing at least one opening therethrough. The openings for optimizing the Backflow Potential Capacity are not governed by the numerical and dimensional restrictions designed to optimize the Bamboo Effect. Rather, these openings, as disclosed in copending U.S. patent application Ser. No. 08/511,878 (our Docket No. 1033-116) are designed to provide discontinuities for optimizing the Backflow Potential Capacity and are preferably longitudinally aligned. Thus, openings provided through the second metal interconnection line are strategically placed so that the longitudinal distance between each end of the second metal interconnection line and an opening, or the longitudinal distance between two openings, is less than the length corresponding to the minimum Backflow Potential Capacity for the second metal interconnection line.

The Backflow Potential Capacity is utilized to reduce electromigration failure in multilevel metal interconnection lines by forming a third insulating layer on the second metal interconnection line in electrical contact. At least one second conductive via is formed through the third insulating layer in electrical contact with the second metal interconnection line at a third contact point longitudinally spaced from the second contact point on the second metal interconnection line by a second longitudinal distance which is less than the length corresponding to the minimum Backflow Potential Capacity for the second metal interconnection line.

As disclosed in copending U.S. patent application Ser. No. 08/511,878 (our Docket No. 1033-116), dimensional considerations are applicable for optimizing the Backflow Potential Capacity of multilevel metal interconnection lines. Thus, the situations where the width of the first and second metal interconnection lines are substantially the same, the optimum length of the second metal interconnection line $L_2$ and the optimum second longitudinal distance $D_2$ are represented by the following formulas:

$$L_2 = D_1 \left( \frac{T_2}{T_1} \right); \tag{2}$$

wherein $D_1$ is the first longitudinal distance, $T_2$ is the thickness of the second metal interconnection line and $T_1$ is the thickness of the first metal interconnection line; and $$D_2 = D_1 \left( \frac{T_2}{T_1} \right); \tag{3}$$

wherein $D_1$, $D_2$ and $T_1$ are as previously defined.

If the width of the first and second metal interconnection lines are that substantially equal, the optimum longitudinal length $L_2$ and distance $D_2$ are represented by the following formulas:

$$L_2 = D_1 \left( \frac{T_2}{T_1} \right) \left( \frac{W_2}{W_1} \right); \tag{4}$$

wherein, $D_1$, $T_1$ and $T_2$ are as previously defined, $W_2$ is the width of the second metal interconnection line and $W_1$ is the width of the first metal interconnection line; and $$D_2 = D_1 \left( \frac{T_2}{T_1} \right) \left( \frac{W_2}{W_1} \right); \tag{5}$$

wherein $D_1$, $D_2$, $T_2$, $T_1$, $W_2$ and $W_1$ are as previously defined.

Figure 3:
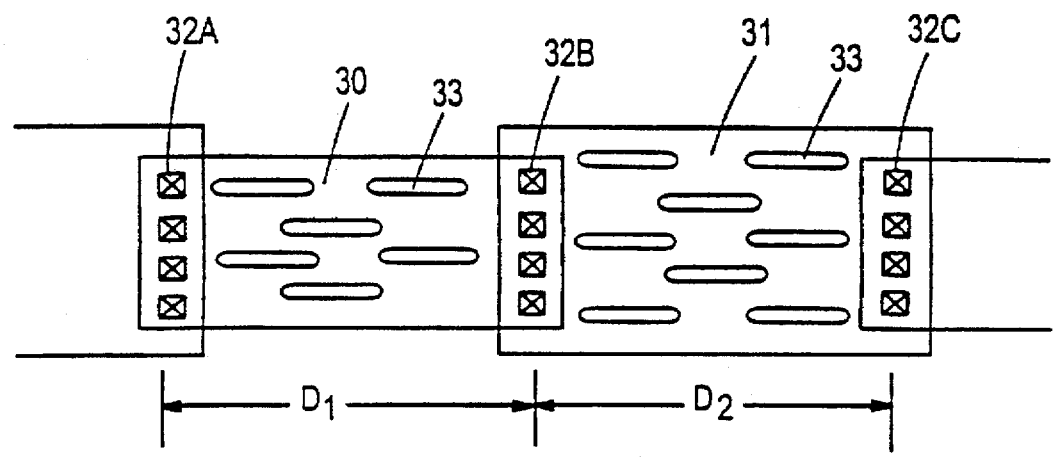
FIG. 3 is a top view of a multilevel interconnection of an embodiment of the present invention.

As shown in FIG. 3, first metal interconnection line 30 is in electrical contact with vias 32A and 32B at contact points longitudinally separated by distance $D_1$. Second metal interconnection line 31, which has a width greater than that of first metal interconnection line 30, is in electrical contact with vias 32B and 32C at contact points longitudinally separated by a distance of $D_2$. Metal interconnection lines 30 and 31 are additional provided with slots 33. The distances $D_1$ and $D_2$ are selected in accordance with formula (5) whereby the Backflow Effect is optimized; while the number and dimension of the slots are governed in accordance with formula (1) wherein the Bamboo Effect is optimized.

Figure 4:
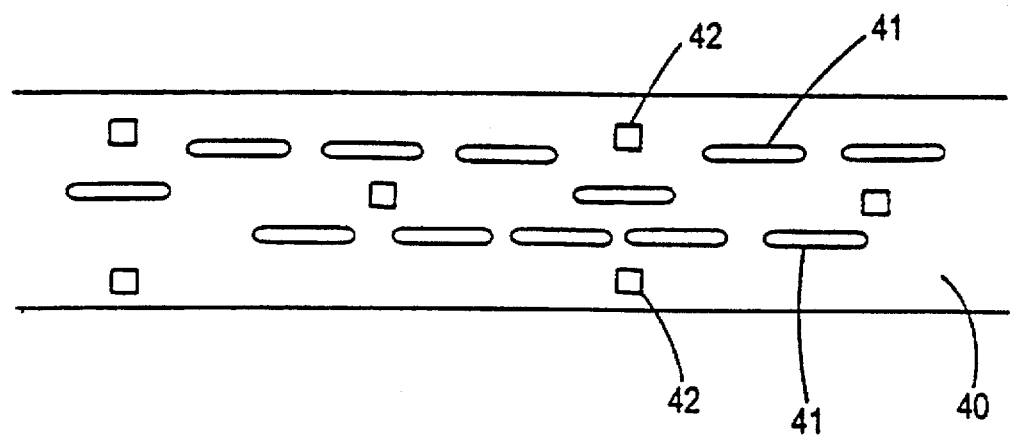
FIG. 4 depicts an embodiment of the present invention applied to a conductive line.

An embodiment of the present invention as applied to a conductive line is depicted in FIG. 4, wherein reference numeral 40 denotes a conductive line which has been provided with slots and openings in accordance with the present invention. As shown in FIG. 4, conductive line 40 is provided with a plurality of elongated slots 41 in order to optimize the width of conductive line 40 consistent with the Bamboo Effect for the metal of the conductive line 40. In addition, conductive line 40 is provided with a plurality of openings 42 designed to optimize the Backflow Potential Capacity for the metal comprising conductive line 40.

The present invention is applicable of all types of semiconductor devices wherein metal interconnection lines are provided, such as bus lines, power supply lines and/or clock lines. In carrying out the present invention, conventional methods of forming conductive patterns comprising features and spacings, such as a plurality of spaced apart conductive lines, and metal interconnection lines can be employed, such as conventional photolithographic techniques, etching techniques and damascene techniques. The present invention is applicable to semiconductor devices comprising interconnection patterns having a wide range of dimensions, including submicron dimensions, which conductive patterns are formed in a conventional manner, as by conventional etch back techniques or single and/or dual damascene techniques.

Typically, a first insulating layer is deposited and a conductive pattern formed. The conductive pattern can be formed by conventional etch back techniques involving the deposition of a metal layer and etching to form a conductive pattern comprising a plurality of spaced apart conductive lines. The conductive pattern can also be formed by a damascene technique in which openings are formed in the insulating layer and metal deposited in the openings to form the conductive pattern. Subsequently, a second insulating layer is deposited and a metal interconnection line is formed on the second insulating layer. The conductive pattern and interconnection line can be formed by a dual damascene technique in which the conductive pattern and metal interconnection line are deposited by a single metal deposition process.

Damascene is an art which has been employed for centuries in the fabrication of jewelry, and has recently been adapted for application in the semiconductor industry. Damascene basically involves the formation of a trench which is filled with a metal. Thus, damascene differs from the traditional etch back techniques of providing an interconnection structure by forming a pattern of trenches in a dielectric layer, which trenches are filled in with metal to form the conductive pattern followed by planarization vis-a-vis the traditional etch back technique of depositing a metal layer, forming a conductive pattern with interwiring spacings, and filling in the interwiring spacings with dielectric material. Single and dual damascene techniques have also been employed to form openings in a dielectric layer which are subsequently filled with metal. The application of damascene techniques to the manufacture of semiconductor devices is disclosed in Joshi, "A New Damascene Structure for Submicrometer Interconnect Wiring," IEEE Electron Letters, Vol. 14, No. 3, March 1993, pp. 129–132; Kaanta et al., "Dual Damascene: A ULSI Wiring Technology," June 11–12, 1991, VMIC Conference, IEEE, pp. 144–152; Kenney et al., "A Buried-Plate Trench Cell for a 64-Mb DRAM," 1992 Symposium on VLSI Technology Digest of Technical Papers, IEEE, pp. 14–15; U.S. Pat. No. 5,262,354; and U.S. Pat. No. 5,093,279.

In forming interconnection lines in accordance with the present invention employing a damascene technique, portions of the dielectric layer in the trench are not etched. A further trench is filled in with metal, the unetched portions of the dielectric layer form slots in the interconnection layer for optimizing the Bamboo Effect and openings for optimizing the Backflow Potential Capacity. After formation of the wiring pattern, planarization is effected as by chemical-mechanical polishing.

In carrying out the present invention, the interconnection line can be formed of any metal typically employed for forming an interconnection line, such as aluminum, aluminum alloys, copper, copper alloys, gold, gold alloys, silver, silver alloys, refractory metals, refractory metal alloys, and refractory metal compounds. A conventional adhesion/barrier layer can also be employed, such as titanium, titanium-tungsten, titanium nitride or titanium oxynitride. The metal interconnection line of the present invention can be formed by any technique conventionally employed in the manufacture of semiconductor devices. For example, the method interconnection line can be formed by conventional metallization techniques, such as various types of chemical vapor deposition (CVD) processes, including low pressure chemical vapor deposition (LPCVD), and plasma enhanced chemical vapor deposition (PECVD). Normally, when high melting metal points such as tungsten are deposited, CVD techniques are employed. Low melting point metals, such as aluminum and aluminum-base alloys, including aluminum-copper alloys, can be deposited by melting, sputtering or physical vapor deposition (PVD).

The present invention is also applicable to the manufacture of semiconductor devices comprising a plurality of conductive patterns formed on different levels, including conductive patterns formed by etch back techniques and/or damascene and dual damascene techniques. In a preferred embodiment, such semiconductor devices comprising a plurality of conductive patterns on different levels also comprise a plurality of metal interconnection lines, having a length less than the length corresponding to the minimum Backflow Potential Capacity for the metal interconnection line, or having a length adjusted, as by openings or vias, so that the distance between the openings or vias is less than the length corresponding to the minimum Backflow Potential Capacity for the metal interconnection line, thereby reducing electromigration and enhancing the electromigration lifetime of the metal interconnection line. In addition, the metal interconnection lines are provided with the slots, wherein each slot has a length greater than its width, each slot has a maximum width less than the minimum spacing between conductive lines, and the minimum width of each slot is equal to the limit of conventional etching of photolithographic techniques thereby optimizing the Bamboo Effect.

The semiconductor devices to which the claimed invention is directed generally comprise insulating layers formed of insulating materials conventionally employed in the manufacture of semiconductor devices, such as silicon dioxide, including silicon dioxide formed by thermal oxidation, vapor deposition and/or derived from deposited tetraethyl orthosilicate (TEOS), silicon nitride, silicon oxynitrides and/or low dielectric constant materials. Insulating material can be deposited in a conventional manner, as by CVD or thermal enhanced CVD and spin-on techniques. The various embodiments of the present invention involve a conventional semiconductor substrate, such as monocrystalline silicon.

Thus, in accordance with the present invention, the length of a metal interconnection line is advantageously selected in accordance with the design requirements for a particular integrated circuit, while advantageously maximizing the electromigration lifetime by optimizing the Backflow Potential Capacity for the particular metal interconnection line, as by selecting an appropriate line length, providing one or more strategically longitudinally spaced holes or adjusting the distance between the points at which the metal interconnection line is in electrical contact with conductive vias, so that the longitudinal distance between the holes or vias is less than the length corresponding to the minimum Backflow Potential Capacity of the metal interconnection line. In addition, the width of the metal interconnection line is advantageously selected in accordance with the design requirements for a particular integrated circuit, while advantageously maximizing the electromigration lifetime by providing slots, the number and configuration of which are selected to provide a width of actual metal across the interconnection line, between the slots, less than that which corresponds to the minimum time for 50% failure by electromigration according to the Bamboo Effect for that metal.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

We claim:

1. A semiconductor device comprising:
   a conductive pattern having features;
   a first insulating layer formed on the conductive pattern;
   a first metal interconnection line formed on the first insulating layer;
   a second insulating layer formed on the first metal interconnection line; and
   at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; wherein:
   the metal interconnection line comprises one or more slots through the metal interconnection line to the insulating layer;
   each slot has a length greater than its width;
   each slot has a maximum width less than the minimum spacing between the conductive lines; and
   the minimum width of each slot is equal to the limit of etching or photolithography technology, further comprising a second metal interconnection line formed on the second insulating layer and in electrical contact with one of the first conductive vias at a second contact point,
   wherein the width of the first metal interconnection line is essentially the same as the width of the second metal interconnection line,
   a third insulating layer formed on the second metal interconnection line; and
   at least one second conductive via formed through the third insulating layer in electrical contact with the second metal interconnection line at a third contact point longitudinally spaced apart from the second contact point on the second metal interconnection line by a second longitudinal distance which is less than the length corresponding to the minimum Backflow Potential Capacity for the second metal interconnection line.

2. The semiconductor device according to claim 1, wherein the width of the first metal interconnection line is essentially the same as the width of the second metal interconnection line.

3. The semiconductor device according to claim 2, wherein the second longitudinal distance is $D_2$ is represented by the formula:

$$D_2 = D_1 \left( \frac{T_2}{T_1} \right);$$

wherein $D_1$ is the first longitudinal distance, $T_2$ is the thickness of the second metal interconnection line and $T_1$ is the thickness of the first metal interconnection line.

4. The semiconductor device according to claim 1, wherein the width of the first metal interconnection line is not substantially equal to the width of the second metal interconnection line.

5. The semiconductor device according to claim 4, wherein the second longitudinal distance ($D_2$) is represented by the formula:

$$D_2 = D_1 \left( \frac{T_2}{T_1} \right) \left( \frac{W_2}{W_1} \right);$$

wherein $D_1$ is the first longitudinal distance, $T_2$ is the thickness of the second metal interconnection line; $T_1$ is the thickness of the first metal interconnection line; $W_2$ is the width of the second metal interconnection line; and $W_1$ is the width of the first metal interconnection line.

6. The semiconductor device according to claim 1, wherein the length of the second metal interconnection line is greater than the length corresponding to the minimum Backflow Potential Capacity for the second metal interconnection line.

7. A semiconductor device comprising:

a conductive pattern having features;

a first insulating layer formed on the conductive pattern;

a first metal interconnection line formed on the first insulating layer;

a second insulating layer formed on the first metal interconnection line; and at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; wherein:

the metal interconnection line comprises one or more slots through the metal interconnection line to the insulating layer;

each slot has a length greater than its width;

each slot has a maximum width less than the minimum spacing between the conductive lines; and the minimum width of each slot is equal to the limit of etching or photolithography technology, further comprising a second metal interconnection line formed on the second insulating layer and in electrical contact with one of the first conductive vias at a second contact point, wherein the width of the first metal interconnection line is essentially the same as the width of the second metal interconnection line; the length of the second metal interconnection line ($L_2$) is represented by the formula:

$$L_2 = D_1 \left( \frac{T_2}{T_1} \right);$$

wherein $D_1$ is the first longitudinal distance; $T_2$ is the thickness of the second metal interconnection line, and $T_1$ is the thickness of the first metal interconnection line.

8. A semiconductor device comprising:

a conductive pattern having features;

a first insulating layer formed on the conductive pattern;

a first metal interconnection line formed on the first insulating layer;

a second insulating layer formed on the first metal interconnection line; and at least two longitudinally spaced apart first conductive vias formed through the second insulating layer in electrical contact with the first metal interconnection line at first contact points separated by a first longitudinal distance which is less than the length corresponding to the minimum Backflow Potential Capacity for the first metal interconnection line; wherein:

the metal interconnection line comprises one or more slots through the metal interconnection line to the insulating layer;

each slot has a length greater than its width;

each slot has a maximum width less than the minimum spacing between the conductive lines; and the minimum width of each slot is equal to the limit of etching or photolithography technology, further comprising a second metal interconnection line formed on the second insulating layer and in electrical contact with one of the first conductive vias at a second contact point, wherein the width of the first metal interconnection line is not substantially equal to the width of the second metal interconnection line, the length of the second metal interconnection line ($L_2$) is represented by the formula:

$$L_2 = D_1 \left( \frac{T_2}{T_1} \right) \left( \frac{W_2}{W_1} \right);$$

wherein $D_1$ is the first longitudinal distance, $T_2$ is the thickness of the second metal interconnection line; $T_1$ is the thickness of the first metal interconnection line; $W_2$ is the width of the second metal interconnection line; and $W_1$ is the width of the first metal interconnection line.

* * * * *